United States Patent
Katagiri

(10) Patent No.: US 10,401,681 B1
(45) Date of Patent: Sep. 3, 2019

(54) HEAT SINK FOR ELECTRONIC DISPLAY DEVICE

(71) Applicant: Panasonic Liquid Crystal Display Co., Ltd., Hyogo (JP)

(72) Inventor: Yusuke Katagiri, Hyogo (JP)

(73) Assignee: PANASONIC LIQUID CRYSTAL DISPLAY CO., LTD., Hyogo (JP)

( * ) Notice: Subject to any disclaimer, the term of this patent is extended or adjusted under 35 U.S.C. 154(b) by 0 days.

(21) Appl. No.: 16/201,343

(22) Filed: Nov. 27, 2018

(51) Int. Cl.
*G02F 1/1333* (2006.01)
*H05K 7/20* (2006.01)
*G02F 1/1335* (2006.01)
*F28F 13/06* (2006.01)

(52) U.S. Cl.
CPC ........ *G02F 1/133608* (2013.01); *F28F 13/06* (2013.01); *G02F 1/133308* (2013.01); *H05K 7/20963* (2013.01); *G02F 1/133603* (2013.01); *G02F 2001/133314* (2013.01); *G02F 2001/133628* (2013.01)

(58) Field of Classification Search
CPC ............... G02F 2001/133628; H05K 7/20963
See application file for complete search history.

(56) References Cited

U.S. PATENT DOCUMENTS

| | | | | |
|---|---|---|---|---|
| 7,651,249 B2 * | 1/2010 | Ohashi | .................. | G02B 6/0085 362/373 |
| 7,667,782 B2 | 2/2010 | Iwai et al. | | |
| 8,113,697 B2 * | 2/2012 | Teng | .......................... | F21K 9/00 362/373 |
| 8,142,042 B2 * | 3/2012 | Shibata | ............. | G02F 1/133603 362/294 |
| 8,184,229 B2 * | 5/2012 | Nagaoka | ........... | G02F 1/133604 349/56 |
| 8,400,607 B2 * | 3/2013 | Cappaert | ............... | G02B 6/0085 349/161 |
| 8,514,569 B2 * | 8/2013 | Chou | ....................... | G09F 13/04 361/690 |
| 8,545,081 B2 * | 10/2013 | Kuo | ......................... | F21V 29/02 362/607 |
| 8,702,262 B2 * | 4/2014 | Park | .................. | G02F 1/133608 362/630 |
| 9,039,267 B2 * | 5/2015 | Que | ................... | G02F 1/133615 362/612 |
| 9,081,126 B2 * | 7/2015 | Ishimoto | ............... | G02B 6/0085 |
| 9,316,385 B2 * | 4/2016 | Maeda | ..................... | F21V 29/00 |
| 2016/0150683 A1 * | 5/2016 | Sagerian | .................. | H04N 5/64 361/714 |

\* cited by examiner

*Primary Examiner* — Hung V Ngo
(74) *Attorney, Agent, or Firm* — Hamre, Schumann, Mueller & Larson, P.C.

(57) ABSTRACT

A heat sink that is configured to be disposed between a rear frame and a rear cover of an electronic display device. The heat sink includes a base plate, a mount plate spaced apart from the base plate, and a plurality of fins. The base plate is configured to be coupled to the rear frame. The mount plate is configured to be coupled to the rear cover. An electronic display device includes a rear frame, a rear cover, and the heat sink. The base plate of the heat sink is coupled to the rear frame and the mount plate of the heat sink is coupled to the rear cover.

20 Claims, 6 Drawing Sheets

HEAT SINK FOR ELECTRONIC DISPLAY DEVICE

FIELD

This disclosure relates to electronic display devices that display an image. More specifically, this disclosure relates to heat sinks in such electronic display devices.

BACKGROUND

An electronic display device displays an image by filtering light. For example, an electronic display device may include a light source and one or more components (e.g., a liquid crystal display ("LCD") panel, diffuser, etc.) configured to filter the light emitted from the light source. The electronic display device includes a back cover that is attached to a frame of the electronic display device. Electronic display devices would also include separate attachment structure(s) (e.g., an attachment plate, inset portions in the rear cover, etc.) that were specifically provided for attaching the back cover to the frame of the electronic display device.

BRIEF SUMMARY

An electronic display device includes a rear frame, a rear cover, and a heat sink. The heat sink is disposed between the rear frame and the rear cover. The heat sink includes a base plate, a mount plate, and fins. The base plate is configured to be coupled to the rear frame and the mount plate is configured to be coupled to the rear frame. The fins includes a plurality of first fins that extend from the base plate, a plurality of second fins that extend from the mount plate, and a bridge fin connecting the base plate and the mount plate.

Embodiments for an electronic display device and a heat sink are disclosed. In some embodiments, the fins extend parallel relative to each other. The first fins extend past a plane defined by the front surface of the mount plate. The second fins extend past a plane defined by a rear surface of the base plate.

In an embodiment, the first fins do not extend past a plane defined by the mount plate. In another embodiment, the first fins extend at least to the plane defined by the mount plate.

In an embodiment, at least one of the first fins is shorter than the second fins. In another embodiment, the first fins and second fins have the same length.

In an embodiment, the bridge fin has a thickness that is greater than the thickness of the first fins and the thickness of the second fins.

In an embodiment, the heat sink is coupled to the rear frame with one or more screws, and the rear cover is coupled to the heat sink with one or more screws. The base plate includes one or more holes that are each configured to receive one of the screws to couple the base plate of the heat sink to the rear frame. The mount plate includes one or more holes that are each configured to receive one of the screws to couple the mount plate of the heat sink to the rear cover.

In an embodiment, the electronic display device includes a first cushion member and a second cushion member. The first cushion member is disposed between the heat sink and the rear cover. The second cushion member is disposed between the heat sink and the rear frame and is configured to transfer heat from the rear frame to the second fins.

BRIEF DESCRIPTION OF THE DRAWINGS

References are made to the accompanying drawings that form a part of this disclosure, and which illustrate embodiments in which the electronic display device and heat sink described in this specification can be practiced.

Like reference numbers represent like parts throughout.

DETAILED DESCRIPTION

An electronic display device displays an image to a viewer. The electronic display device includes a light source and is configured to filters the light emitted by the light source to display the desired image. The electronic display device includes a rear frame and a rear cover. Previously, the electronic display device included an attachment structure specifically for attaching the rear cover to the rear frame. A screw, pin, or other attachment component was then utilized to attach the rear cover to the attachment structure. The electronic display device would include additional space for the attachment structure, which increased the size of the electronic display device.

Some electronic display devices include a heat sink. A heat sink is configured to dissipate the heat generated by one or more components of the electronic display device. For example, heat sinks are configured to have a large surface area to volume ratio so that they more efficiently transfer heat.

Embodiments disclosed herein are related to electronic display devices and heat sinks for electronic display devices. An electronic display device includes a rear frame, a rear cover, and a heat sink disposed between the rear frame and the rear cover. The heat sink includes a base plate configured to be coupled to the rear frame and a mount plate configured to be coupled to the rear cover. The heat sink is used for attaching the rear cover to the heat sink such that the electronic display structure does not need to include a separate attachment structure for attaching the rear cover.

Figure 1:
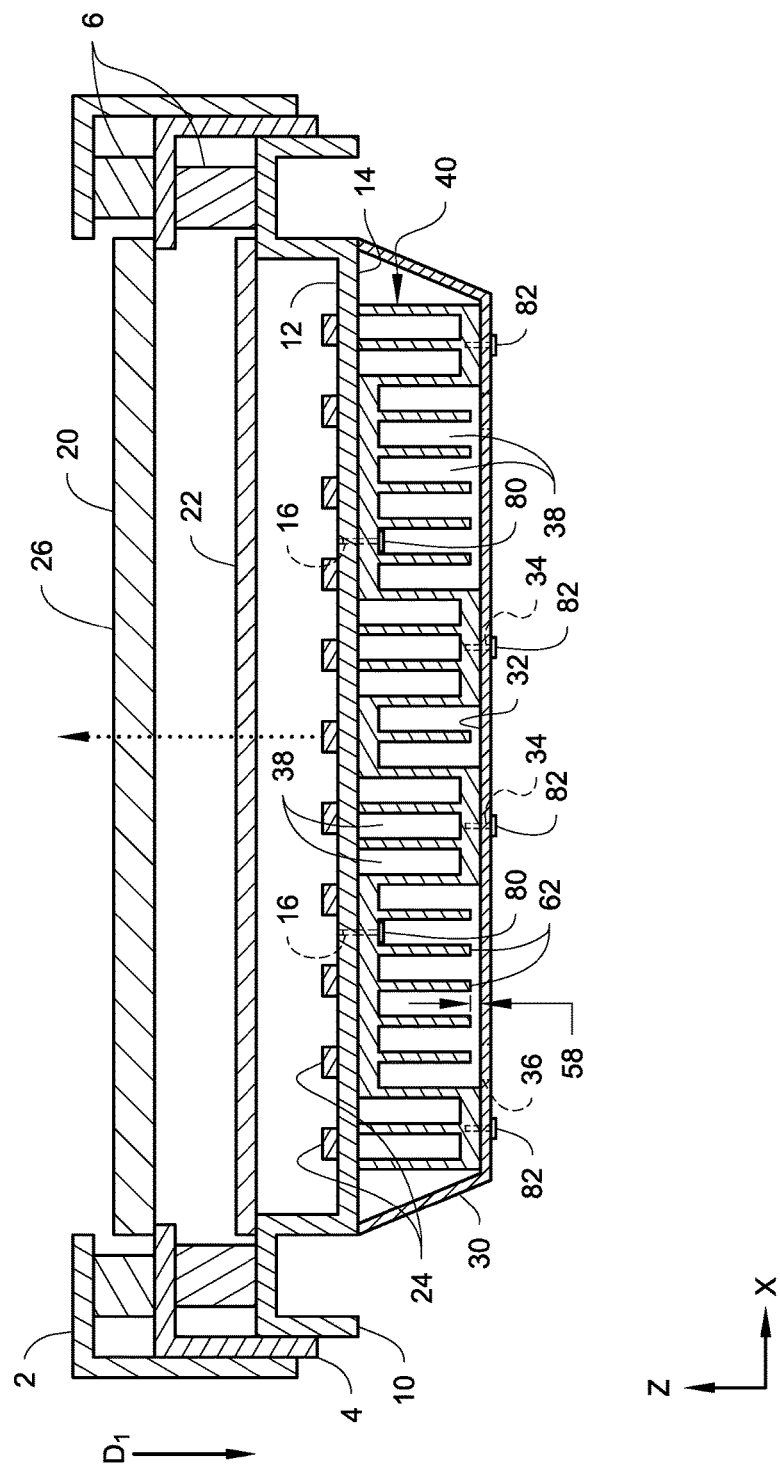
FIG. 1 is a cross section of an electronic display device according to an embodiment.

FIG. 1 is a cross-section of an electronic display device 1. The electronic display device 1 includes frames 2, 4, 10, a rear cover 30, and a heat sink 40. The front frame 2, the middle frame 4, and the rear frame 10 are spaced apart in a thickness direction $D_1$ of the electronic display device 1 by spacers 6.

A viewer watches a viewing surface 26 of the electronic display device 1. The electronic display device is configured to emit filtered light from the viewing surface 26 in the form of an image. The electronic display device 1 includes a liquid crystal display ("LCD") panel 20, an optical sheet 22, and light emitting diodes ("LEDs") 24. Light emitted by the LEDs 24 is manipulated by the optical sheet 22 and filtered by the LCD panel 20 to form the desired image. An example of a path of the light emitted by one of the LEDs 24 is shown in FIG. 1 by a dotted line. For example, the optical sheet 22 may be or include a diffuser configured to diffuse the light emitted by the individual LEDs 24. The LCD panel 20 is configured to filter the light passing through so that only the specific light for the correct image passes through the viewing surface 26 and is observed by the viewer.

It should be understood that the electronic display device 1 in an embodiment may include other components for filtering and/or manipulating the light emitted by the LEDs 24 in addition to or instead of the optical sheet 22 and the LCD panel 20. For example, the other components may include a second LCD panel, diffusers, polarizers, or other similar components. In an embodiment, the electronic display device 1 may include a different type of light source then the LEDs 24. For example, the electronic display device 1 may include a halogen light source or a florescent light source instead of the LEDs 24.

Figure 2:
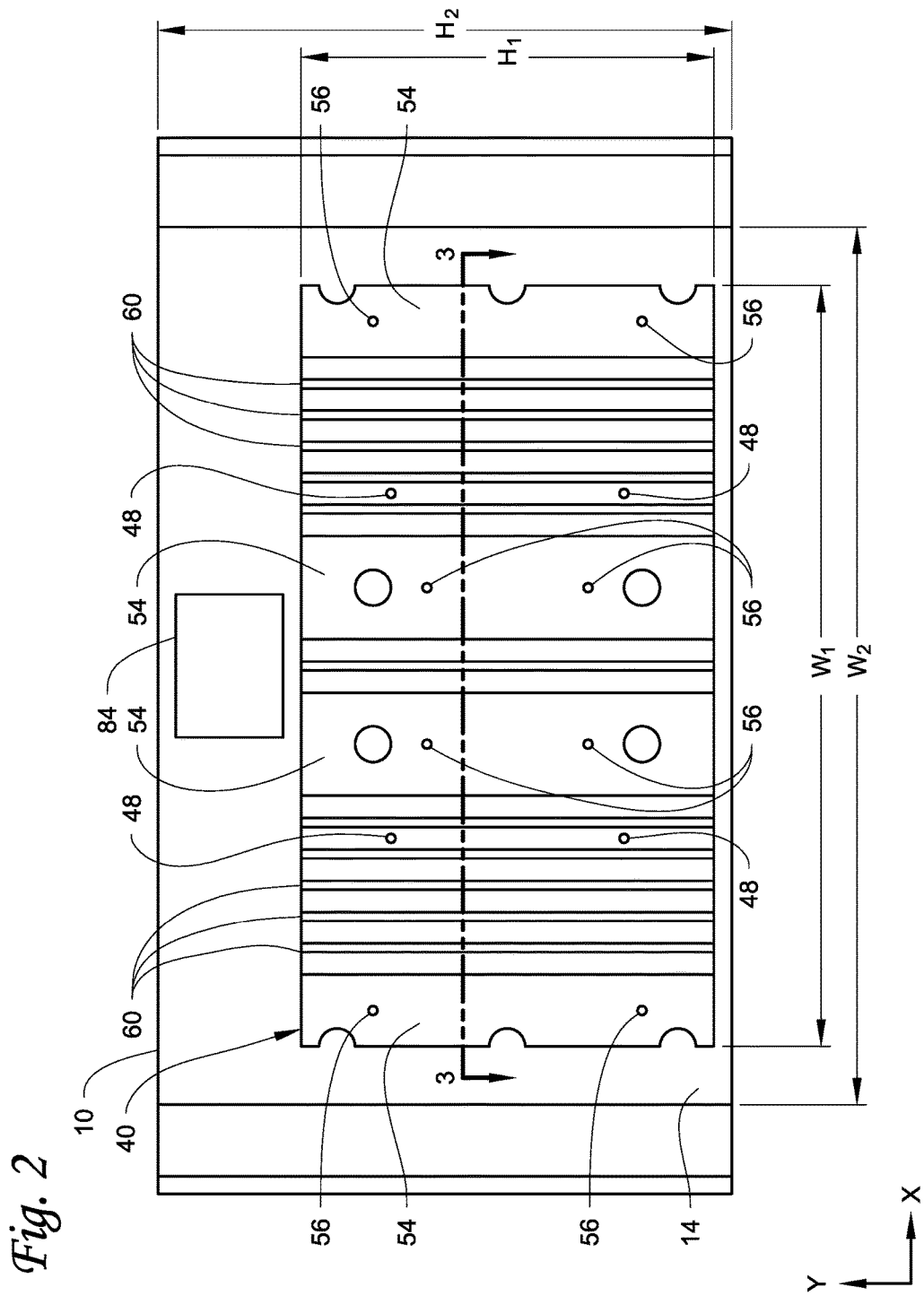
FIG. 2 is a plan view of the heat sink and rear frame in FIG. 1.
Figure 3:
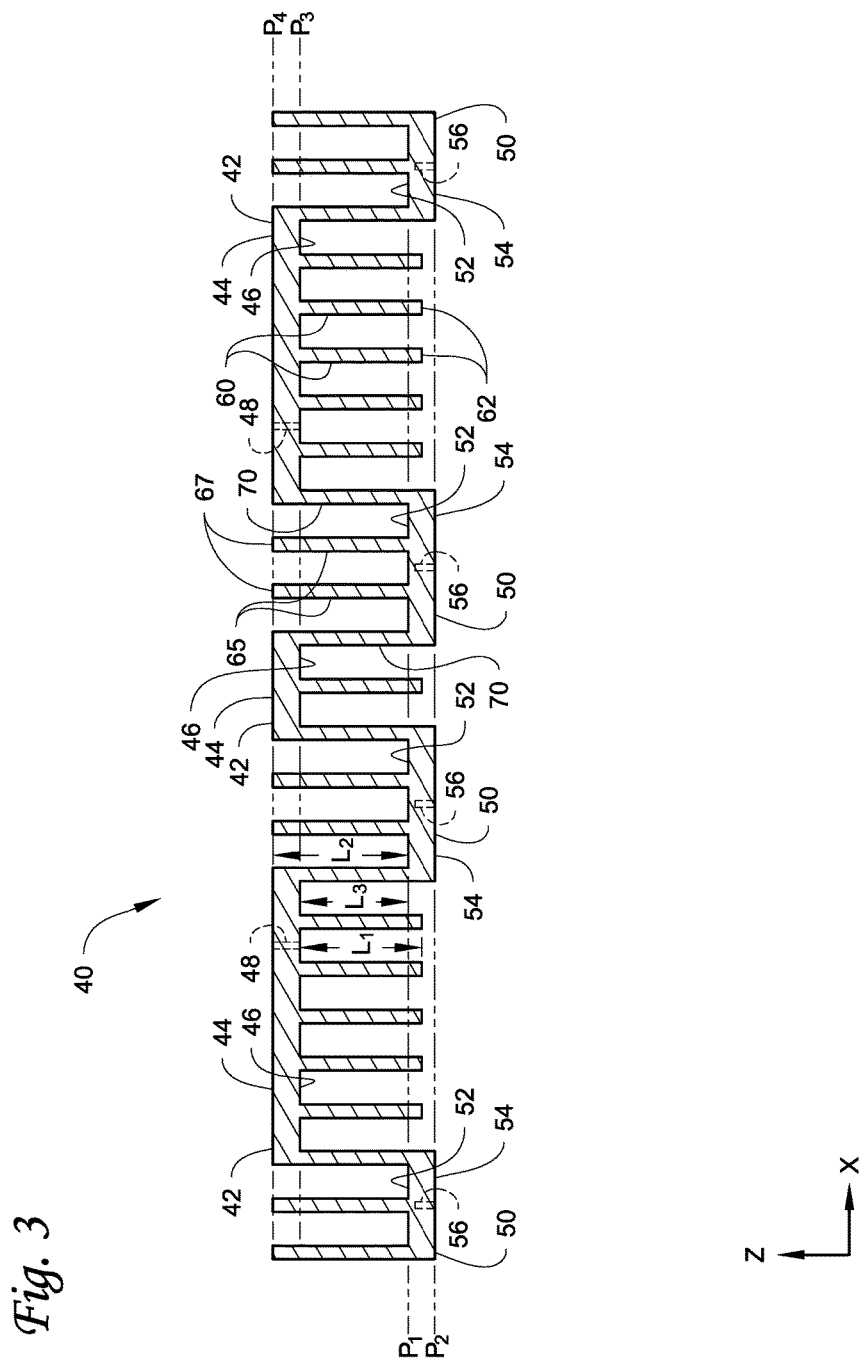
FIG. 3 is a cross-sectional view of the heat sink in FIGS. 1 and 2 along the line F3-F3 in FIG. 2.

The heat sink 40 is disposed between the rear frame 10 and the rear cover 30. The heat sink 40 is made of a metallic material. For example, the heat sink 40 may be made of aluminum or copper. As shown in FIGS. 2 and 3, a cross-sectional shape of the heat sink 40 is consistent except for the holes. Thus, the heat sink 40 in an embodiment may be easily formed by using metal extrusion molding and providing holes in the extruded metal piece using a suitable method (e.g., drilling, stamping, etc.).

The electronic display device 1 includes one or more components that generate significant heat. These one or more components can be coupled to the rear frame 10. In FIG. 1, the LEDs 24 are coupled to the front surface 12 of the rear frame 10 and generate a significant amount of heat during operation. The heat generated by the LEDs 24 is transferred to the rear frame 10. In an embodiment, the electronic display device 1 may have other heat generating component(s) in addition to or in alternative to the LEDs 24. For example, the LEDs 24 may be replaced with OLEDs or a different type of light source that generates a significant amount of heat during operation.

The heat sink 40 is configured to transfer heat from the rear frame 10 to air flowing along the heat sink 40. For example, the electronic display device 1 is configured to direct air through channels 38 in the heat sink 40. The rear cover 30 includes air holes 36. The air holes 36 allow air from outside of the electronic display device 1 to enter the electronic display device 1, flow along the surfaces of the heat sink 40 (e.g., through the channels 38), and exit the electronic display device 1. The external air flows past and absorbs heat from the heat sink 40. For example, air holes 36 may be disposed along an open end of the channels 38 and/or the along the fan 83 in a Y direction (e.g., in the Y direction in FIG. 2).

The rear frame 10 is made of a metal material. For example, the rear frame 10 may be made of aluminum. The metal material of the rear frame 10 allows it to more easily absorb and transfer heat from the heat generating component(s) coupled to the rear frame 10. The heat sink 40 is coupled to the rear frame 10 and is configured to absorb and transfer heat from the rear frame 10 to the air flowing along the heat sink 40.

FIG. 2 is a plan view of the rear frame 10 and heat sink 40 without screws 80, 82. The heat sink 40 has a height $H_1$ and a width $W_1$, and the rear surface 14 of the rear frame 10 has a height $H_2$ and a width $W_2$. As shown in FIGS. 1 and 2, the heat sink 40 has a width $W_1$ that is substantially the same as the width $W_2$ of the rear surface 14 of the rear frame 10. For example, the width $W_2$ of the heat sink 40 extends along at least 90% of the width $W_2$ of the rear surface 14. In an embodiment, the width $W_1$ of the heat sink 40 may be 50-650 mm. In an embodiment, the width $W_1$ of the heat sink 40 may be 500-650 mm. In an embodiment, the height $H_1$ of the heat sink 40 may be 50-350 mm. In an embodiment, the height $H_1$ of the heat sink 40 may be 300-350 mm.

As shown in FIG. 2, the electronic display device 1 also includes a fan 84. The fan is 84 is disposed between the rear frame 10 and the rear cover 30. The fan 84 is configured to increase the flow of air through the channels 38 of the heat sink 40. The fan 84 is located along an end of the heat sink 40 near open ends of the channels 38. The fan 84 can help suction the air through the channels 38, increasing the cooling of the heat sink 40 by the air. In FIG. 2, a single fan 84 is disposed between the rear frame 10 and the rear cover 30. However, the electronic display device 1 may multiple of the fans 84 in an embodiment.

The electronic display device 1 in FIG. 1 has a single heat sink 40. However, the electronic display device 1 in an embodiment may include multiple heat sinks 40. In an embodiment, the electronic display device 1 may include multiple heat sinks 40 disposed between the rear frame 10 and the rear cover 30. For example, the heat sinks 40 may be arranged side by side along the X direction in FIG. 1 so as to have a combined width similar to the width $W_1$ of the heat sink 40 in FIGS. 1 and 2.

The heat sink 40 is coupled to the rear frame 10 and the rear cover 30 is coupled to the rear frame 10. FIG. 3 is a cross-sectional view of the heat sink 40 along the line F3-F3 in FIG. 2. The heat sink 40 includes base plates 42, mount plates 50, first fins 60, second fins 65, and bridge fins 70.

As shown in FIG. 3, all of the base plates 42 extend along a same plane (e.g., along an X-Y plane), and all of the mount plates 50 extend along a same plane (e.g., along an X-Y plane). The base plates 42 and the mount plates 50 extend along different planes that are parallel to each other. The base plates 42 are spaced apart from the mount plates 50 in a first direction (e.g., the Z direction in FIGS. 1 and 3). As shown in FIG. 1, the base plates 42 and the mount plates 50 are spaced apart along the thickness direction $D_1$ of the electronic display device 1. A base plate 42 includes a front surface 44 and a rear surface 46. A mount plate 50 includes a front surface 52 and a rear surface 54.

The heat sink 40 in FIGS. 1-3 includes three base plates 42 and four mount plates 50. However, it should be appreciated that the heat sink 40 may have a different number of the base plates 42 and/or mount plates 50 in an embodiment. In an embodiment, the heat sink 40 may include at least one base plate 42 and at least one mount plate 50. In an embodiment, the heat sink 40 may include one base plate 42 and one mount plate 50. In another embodiment, the heat sink 40 may include at least one base plate 42 and at least two mount plates 50. In another embodiment, the heat sink 40 may include at least two base plates 42 and at least one mount plate 50.

Each of the first fins 60 illustrated in FIG. 3 extends from one of the base plates 42. As shown in FIG. 3, each of the base plates 42 has at least one first fin 60. Two of the base plates 42 have a plurality of the first fins 60. The first fins 60 extend past a plane $P_1$ defined by the front surface 52 of an adjacent mount plate 50. The first fins 60 do not extend past a plane $P_2$ defined by the rear surface 54 of an adjacent mount plate 60. The first fins 60 have ends 62 that are opposite to the base plate 42. As shown in FIG. 1, the first fins are configured so that their ends 62 do not contact the rear cover 30 and a space 58 is provided between the ends 62 of the first fins 60 and the rear cover 30. The space 58 is an open space. The space 58 allows for air to flow more easily through the channels 38 of the heat sink 40 so as to increase heat transfer from the heat sink 40. In an embodiment, a cushion member may be disposed in the space 58.

For example, one of the cushion members 292 as discussed below with respect to FIG. 5 may be disposed in the space 58.

Each of the first fins 60 extends from one of the base plates 42 in a direction that is perpendicular to the rear surface 46 of its respective base plate 42. However, it should be appreciated that the first fins 60 in an embodiment may extend at a different angle then shown in FIG. 1. In an embodiment, the first fins 60 may extend at a non-perpendicular angle relative to the base plate. In an embodiment, the first fins 60 may be curved.

Each of the second fins 65 extends from one of the mount plates 50. As shown in FIG. 3, each of the mount plates 50 has at least one second fin 65. Two of the mount plates 50 have a plurality of second fins 65. The second fins 65 extend past a plane $P_3$ defined by the rear surface 46 of an adjacent base plate 42. The second fins 65 extend to at least a plane $P_4$ defined by a front surface 44 of an adjacent base plate 42. More specifically, the second fins 65 extend to the plane $P_4$ of the adjacent base plate 42.

Each of the second fins 65 has an end 67 that is opposite to the mount plate 50. The second fins 65 are configured so that their ends 67 contact the rear frame 10. The contact between the ends 67 and the rear frame 10 allows heat to be conducted from the rear frame 10 into the second fins 65 through their ends 67. This contact can beneficially increase the heat transfer from the rear frame 10 to the heat sink 30 by increasing the contact area between the rear frame 10 and the heat sink 30.

Each base plate 42 is connected to an adjacent mount plate 50 by a bridge fin 70. Adjacent is in a direction perpendicular to the direction in which the base plates 42 and mount plates 50 are spaced apart (e.g., direction X in FIG. 3, perpendicular to the thickness direction $D_1$ in FIG. 1). Each bridge fin 70 extends between and connects its respective base plate 42 and mount plate 50. Adjacent base plates 42 are connected by two bridge fins 70 and one mount plate 50. Adjacent mount plates 50 are connected by two bridge fins 70 and one mount plate 50. A bridge fin 70 connects to the rear surface 46 of a base plate 42 and the front surface 52 of a mount plate 50. The heat sink 40 in FIG. 3 includes six bridge fins 70. However, it should be understood that the number of bridge fins 70 is based on the number of base plates 42 and mount plates 50 in an embodiment. As discussed above, the heat sink 40 may include one or more base plates 42 and one or more mount plates 50 in an embodiment. In such an embodiment, the heat sink 40 may include one or more bridge fins 70.

As shown in FIG. 3, the second fins 65 extend parallel to the first fins 60. The first fins 60 and the second fins 65 also extend parallel to the bridge fins 70. However, it should be appreciated that one or more of the first fins 60, the second fins 65, and the bridge fins 70 may extend in non-parallel directions relative to each other in an embodiment. The second fins 65 have a length $L_2$ that is longer than the length $L_1$ of the first fins 60 and the length $L_3$ of the bridge fins 70. The length $L_3$ of a bridge fin 70 is defined as a length from the rear surface 46 of its respective base plate 42 to the front surface 52 of its respective mount plate 50. The length $L_1$ of the first fins 60 is longer than the length $L_3$ of the bridge fins 70.

In an embodiment, the fins 60, 65, 70, each have a respective length $L_1$, $L_2$, $L_3$ of 5-30 mm. In an embodiment, a difference in the length $L_2$ of the second fins 65 and the length $L_1$ of the first fins 60 (i.e., $L_2$-$L_1$) is 1-3 mm. In an embodiment, a difference between the length $L_2$ of the second fins 65 and the length $L_3$ of the bridge fins 70 (i.e., $L_2$-$L_3$) is 2-4 mm.

The first fins 60, the second fins 65, and the bridges fins 70 are spaced apart from each other. The fins 60, 65, 70 are spaced apart in a direction perpendicular to the direction in which the base plates and the mount plates are spaced apart (e.g., perpendicular to the thickness direction $D_1$ of the electronic display device 1, in the X direction in FIG. 3). The spacing between the fins 60, 65, 70 forms the channels 38 of heat sink 40.

The base plates 42 are configured to be coupled to the rear frame 10. The heat sink 40 is coupled to the rear frame 10 by one or more of the base plates 42. As shown in FIGS. 1 and 3, the front surfaces 44 of the base plates 42 are planar and extend along the same plane $P_4$. The front surfaces 44 are configured to match with the rear surface 14 of the rear frame 10. The front surfaces 44 provide the heat sink 40 with a planar front surface for coupling the heat sink 40 to the rear frame 10.

The heat sink 40 is coupled to the rear frame 10 with screws 80. The base plates 42 include holes 48 configured to receive the screws 80. A screw 80 extends through a hole 48 of the base plate 42 and into a corresponding hole 16 in a rear frame 10. The hole 16 in the rear frame 10 is a blind hole. The rear frame 10 may include a hole 16 for each of the holes 48 in the heat sink 40. In an embodiment, the heat sink 40 may include one or more of the holes 48 for coupling the heat sink 40 to the rear frame 10. In such an embodiment, a single base plate 42 may include one or more of the holes 16.

The mount plates 50 are configured to be coupled to the rear cover 30. The heat sink 40 is coupled to the rear cover 30 by one or more of the mount plates 50. As shown in FIGS. 1 and 3, the rear surfaces 54 of the mount plates 50 are planar and extend along the same plane $P_2$. The rear surfaces 54 of the mount plates 50 are configured to match with the front surface 32 of the rear cover 30. The rear surfaces 54 of the mount plates 50 provide the heat sink 40 with a planar rear surface for coupling the rear cover 30 to the heat sink 10.

A rear cover 30 is coupled to the heat sink 40 with screws 82. The mount plates 50 include holes 56 configured to receive the screws 82. A screw 82 extends through a hole 34 in the rear cover 30 and into a corresponding hole 56 in a mount plate 50. As shown in FIG. 2, the heat sink 40 includes eight of the holes 56 for coupling the rear cover 30 to the heat sink 40. However, it should be appreciated that the heat sink 40 in an embodiment may include a different number of the holes 56. In an embodiment, the heat sink 40 may include one or more of the holes 56. In such an embodiment, a mount plate 50 may include one or more of the holes 56.

The heat sink 40 is coupled to the rear frame 10 and the rear cover 30 with screws 80, 82. However, it should be appreciated that the heat sink 40 may be coupled to one or both of the rear frame 10 and the rear cover 30 in a different manner. In an embodiment, the heat sink 40 may be coupled, respectively, to the rear frame 10 and/or the rear cover 30 with pins. In an embodiment, the heat sink 40 may be coupled, respectively, to the rear frame 10 and/or the rear cover 30 with glue. The glue may be disposed between the rear frame 10 and the base plate 42 and/or the mount plate 50 and the rear cover 30. In an embodiment, the heat sink 40 may be coupled, respectively, to the rear frame 10 and/or the rear cover 30 with adhesive tape. The adhesive tape may be disposed between the rear frame 10 and the base plate 42 and/or the mount plate 50 and the rear cover 30.

As shown in FIG. 1, the rear cover 30 is coupled to the rear frame 10 via the heat sink 40. The heat sink advantageously allows for the attachment of the rear cover 30 without needing a separate attachment structure specifically for attaching the rear cover 30.

Figure 4:
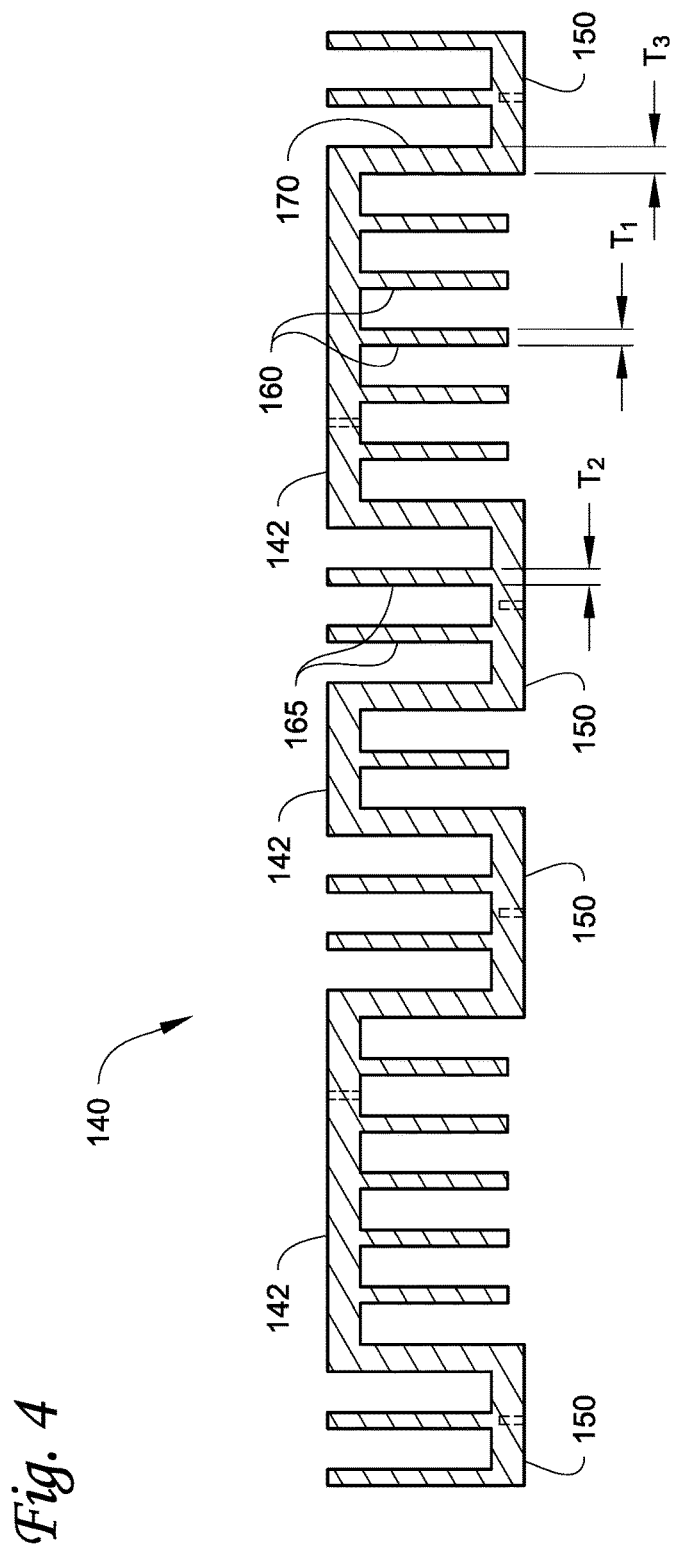
FIG. 4 is a cross-sectional view of a heat sink according to an embodiment.

FIG. 4 is a cross-sectional view of a heat sink 140 according to an embodiment. For example, the heat sink 140 is configured to be disposed in an electronic display device (e.g., the electronic display device 1 of FIG. 1) in a similar manner to the heat sink 40. The heat sink 140 in FIG. 4 is similar to the heat sink 40, except with respect to its bridge fins 170. For example, the heat sink 140 includes base plates 142, mount plates 150, first fins 160, and second fins 165 similar to the heat sink 40 as discussed above.

Each base plate 142 is connected to its adjacent mount plate 150 by a bridge fin 170. The bridge fin 170 extends between and connects the adjacent base plate 142 and mount plate 150. The first fins 160 have a thickness $T_1$ and the second fins 165 have a thickness $T_2$. The bridge fins 170 have a thickness $T_3$. The thickness $T_3$ of the bridge fin 170 is greater than the thickness $T_1$ of the first fins 160 and the thickness $T_2$ of the second fins 165. The first fins 160 have a thickness $T_1$ that is equal to the thickness $T_2$ of the second fins 165.

It should be appreciated that one or more feature(s) of the heat sink 140 (e.g., number of the base plates 142 and/or mount plates 165, configuration of the fins 160, 165) in an embodiment may be similar to the heat sink 40 as discussed above. It should also be appreciated that the features of the heat sink 140 for coupling it to the rear frame and the rear cover (e.g., numbers of holes in the heat sink 140, use of screws for coupling) in an embodiment may be similar to the heat sink 40 as discussed above.

Figure 5:
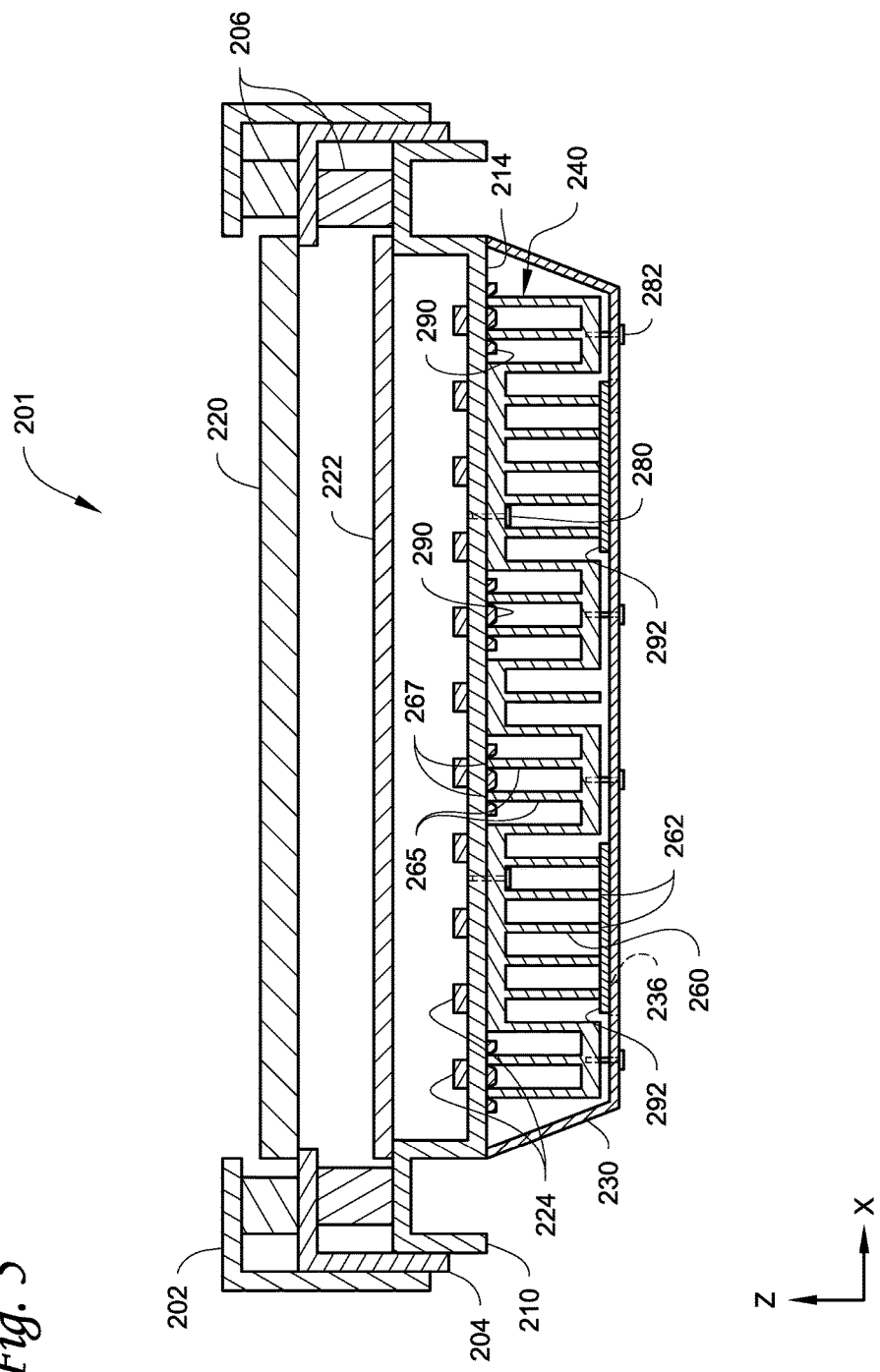
FIG. 5 is a cross section of an electronic display device according to an embodiment.

FIG. 5 is a cross-sectional view of an electronic display device 201 according to an embodiment. The electronic display device 201 in FIG. 5 is similar to the electronic display device 201 as discussed above, except for the configuration of the heat sink 240 and its coupling to a rear frame 210 and a rear cover 230 of the electronic display device 201. For example, the electronic display device 201 includes a front frame 202, a middle frame 204, spacers 206, the rear frame 210, an LCD panel 220, an optical sheet 222, LEDs 224, and screws 280, 282. The rear cover 230 includes air holes 236 to allow external air to pass through the electronic display device 201 and by the heat sink 240 as similarly discussed above with respect to the air holes 36 in FIG. 1. In an embodiment, the electronic display device 201 may have features as similarly discussed above for the electronic display device 1 in FIG. 1. For example, the electronic display device 1 in an embodiment may include other components for filtering and/or manipulating the light emitted by the LEDs 224 in addition to or in alternative to the LCD panel 220 and the optical sheet 222, multiple heat sinks 240, and/or a different light source than the LEDs 224.

Figure 6:
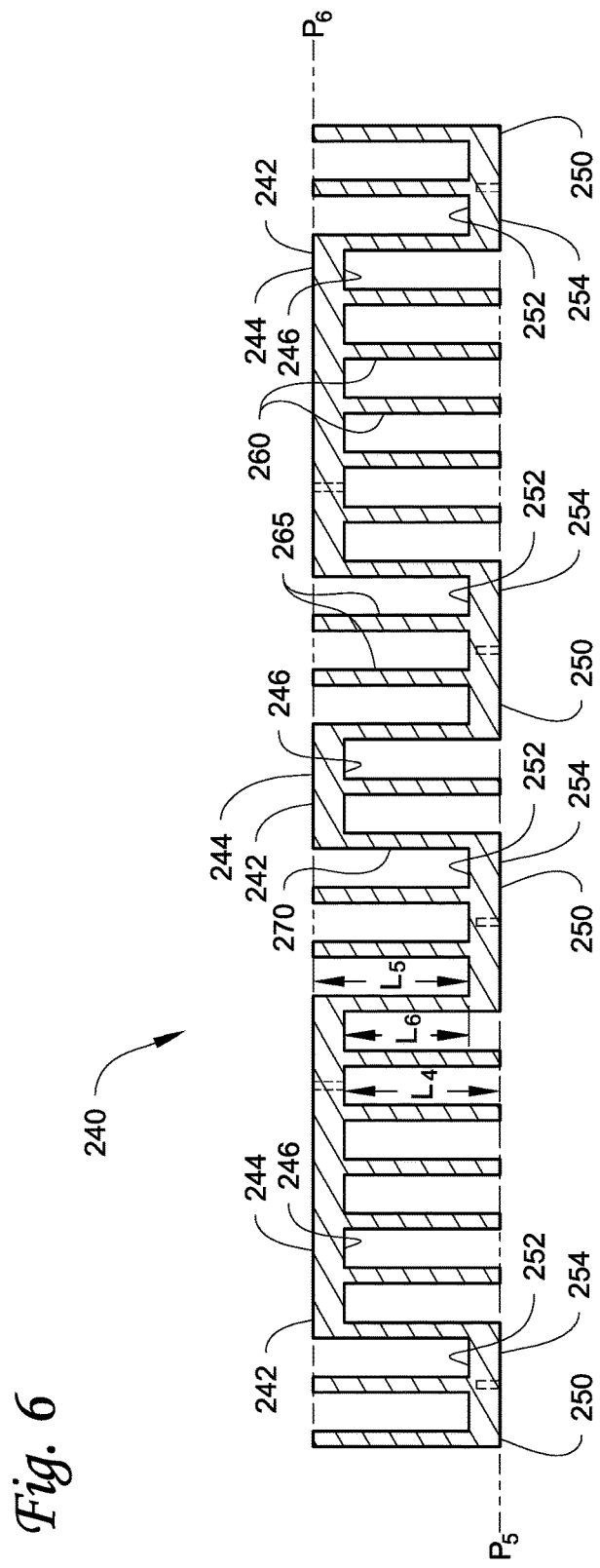
FIG. 6 is a cross-sectional view of the heat sink in FIG. 5.

FIG. 6 is a cross-sectional view of the heat sink 240. The heat sink 240 is similar to the heat sink 40 as discussed above, except for its first fins 260. For example, the heat sink 240 includes base plates 242, mount plates 250, second fins 265, and bridge fins 270. In an embodiment, the heat sink 240 may have features as similarly discussed above for the heat sink 40 in FIGS. 1-3. For example, the heat sink 240 in an embodiment may have fins 260, 265, 270 that do not extend in parallel directions, fins 260, 265, 270 that are curved, and/or one or more fins 260, 265, 270 that extend in a direction that is not perpendicular to their respective base plate 242 or mount plate 250.

Each of the first fins 260 extends from one of the base plates 242. Each of the base plates 242 includes a front surface 244. Each of the mount plates 250 includes a rear surface 254. The first fins 260 have a length $L_4$ and the second fins 265 have a length $L_5$. The bridge fins 270 have a length $L_6$. The length $L_6$ of a bridge fin 270 is defined as a length from the rear surface 246 of its respective base plate 242 to the front surface 252 of its respective mount plate 250. The length $L_4$ of the first fins 260 is equal to the length $L_5$ of the second fins 265. The length $L_4$ of the first fins 260 and the length $L_5$ of the second fins 265 are both longer than the length $L_6$ of the bridge fins 270. As shown in FIG. 6, the first fins 260 extend at least to a plane $P_5$ defined by the rear surface 254 of an adjacent mount plate 250. The second fins 265 extend at least to a plane $P_6$ defined by the front surface 244 of an adjacent base plate 242. More specifically, the first fins 260 extend to the plane $P_5$ and the second fins 265 extend to the plane $P_6$.

In an embodiment, the fins 260, 265, 270, each have a respective length $L_4$, $L_5$, $L_6$ that is 5-30 mm. In an embodiment, a difference between the length $L_4$ of the first fins 260 and the length $L_6$ of the bridge fins 270 (i.e., $L_4$-$L_6$) is 2-4 mm. In an embodiment, a difference between the length $L_5$ of the second fins 265 and the length $L_6$ of the bridge fins 270 (i.e., $L_5$-$L_6$) is 2-4 mm.

As shown in FIG. 5, the electronic display device 201 includes cushion members 290, 292. First cushion members 290 are disposed between the rear frame 210 and heat sink 240. More specifically, each first cushion member 290 is disposed between respective second fins 265 and the rear frame 210. The ends 267 of the second fins 265 each contact one of the first cushion members 290. The first cushion members 290 also contact the rear surface 214 of the rear frame 210. The first cushion members 290 are configured to transfer heat from the rear frame 210 to the second fins 265. The first cushion members 290 may also help prevent movement of the second fins 265 (e.g., rattling). As shown in FIG. 5, the portions of the first cushion members 290 along the ends 267 of the second fins 265 are compressed between the second fins 265 and the rear surface 214 of the rear frame 210. For example, the first cushion members 290 may have a rectangular cross sectional shape similar to the second cushion members 292 being compressed by the second fins 265.

The first cushion members 290 are made of a heat conductive polymer configured for transferring heat. For example, the heat conductive polymer may contain a heat conductive filler that increases its heat transfer properties. The heat conductive filler may be, for example, a metal filler. The heat conductive polymer may include rubber and/or silicone. In an embodiment, the heat resistant polymer may include one or more polymers, fillers, and/or other additives. The heat conductive polymer resists temperatures of up to 60° C. For example, the heat conductive polymer does not to degrade (e.g., melt, crack, breakdown, etc.) when heated to a temperatures of 60° C.

The electronic display device 201 in FIG. 5 has four first cushion members 290 between the rear frame 210 and the heat sink 240. However, the electronic display device 201 in an embodiment may have a different number of first cushion members 290. In an embodiment, the electronic display device 201 may include a single first cushion member 290 instead of multiple cushion members 290. For example, the single first cushion member 290 may extend along each of the first fins 260 of the heat sink 240. In an embodiment, the one or more first cushion members 290 may also be extend between the rear frame 210 and one or more of the base plates 242 and also transfer heat from the rear frame 210 to the one or more base plates 242.

The second cushion members 292 are disposed between the heat sink 240 and the rear cover 230. More specifically, each second cushion member 292 is disposed between the first fins 260 and the rear cover 230. The ends 262 of the first fins 260 contact one of the second cushion members 292. The second cushion members 292 are configured to prevent movement (e.g., rattling) of the first fins 260. The heat sink 240 is spaced apart from the rear cover 230 in FIG. 5. However, electronic display device 201 in an embodiment may be configured so that the rear cover 230 couples to the heat sink 240 such that the rear cover 230 directly contacts the heat sink 240 similar to the rear cover 30 and heat sink 40 in FIG. 1. In such an embodiment, the second cushion members 292 would be compressed along the ends 262 of the first fins 260 similar to the first cushion members 290.

The second cushion members 292 are made of a heat resistant polymer. For example, the heat resistant polymer may be rubber and/or silicon. The heat resistant polymer may include one or more polymers, fillers, and/or other additives. The heat resistant polymer resists temperatures of up to 60° C. For example, the heat resistant polymer does not degrade (e.g., melt, crack, breakdown, etc.) when heated to a temperature of 60° C. In an embodiment, the second cushion members 292 may be made of the same polymer as the first conductive member 290.

The electronic display device 201 in FIG. 5 includes two of the second cushion members 292. However, the electronic display device 201 in an embodiment may include a different number of second cushion members 292. In an embodiment, the electronic display device 201 may include a single second cushion member 292. For example, the single second cushion member 292 may extend along each of the first fins 260 of the heat sink 240.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A heat sink configured to be disposed between a rear frame and a rear cover of an electronic display device, the heat sink comprising:
   a base plate configured to be coupled to the rear frame;
   a mount plate configured to be coupled to the rear cover, the base plate and mount plate being spaced apart in a first direction so that the mount plate is configured to be closer to the rear cover than the base plate when the heat sink is installed in the electronic display device;
   a plurality of first fins that extend from the base plate;
   a plurality of second fins that extend from the mount plate; and
   a bridge fin connecting and extending between the base plate and the mount plate.

2. The heat sink of claim 1, wherein each of the first fins extends from the base plate in a direction perpendicular to a surface of the base plate.

3. The heat sink of claim 1, wherein the first fins extend parallel to the second fins.

4. The heat sink of claim 1, wherein the first direction is perpendicular to a rear surface of the base plate.

5. The heat sink of claim 1, wherein a plane defined by the base plate and a plane defined by the mount plate extend parallel to each other.

6. The heat sink of claim 1, wherein the first fins do not extend past a plane defined by a rear surface of the mount plate.

7. The heat sink of claim 1, wherein the first fins extend at least to a plane defined by a front surface of the mount plate.

8. The heat sink of claim 1, wherein each of the first fins has a length that is equal to or longer than a length of the bridge fin.

9. The heat sink of claim 1, wherein at least one of the first fins is shorter than one of the second fins.

10. The heat sink of claim 1, wherein the first fins each have a first thickness, the second fins each have a second thickness, and the bridge fin has a thickness that is greater than the first thickness of the first fins and the second thickness of the second fins.

11. The heat sink of claim 1, wherein
    the base plate includes a hole configured to receive a first screw for coupling the base plate to the rear frame, and
    the mount plate includes a hole configured to receive a second screw for coupling the mount plate to the rear cover.

12. The heat sink of claim 1, further comprising:
    a second base plate configured to be coupled to the rear frame, the second base plate and the mount plate being spaced apart in the first direction;
    a second bridge fin connecting and extending between the second base plate and the mount plate; and
    one or more first fins that each extend from the second base plate.

13. The heat sink of claim 1, further comprising:
    a second mount plate configured to be coupled to the rear cover, the base plate and the second mount plate being spaced apart in the first direction;
    a second bridge fin connecting and extending between the base plate and the second mount plate; and
    one or more second fins that each extend from the second mount plate.

14. An electronic display device comprising:
    a rear frame;
    a rear cover; and
    a heat sink disposed between the rear frame and the rear cover, the heat sink including:
       a base plate coupled to the rear frame,
       a mount plate coupled to the rear cover, the mount plate disposed closer to the rear cover than the base plate,
       a bridge fin extending between and connecting the base plate and the mount plate,
       a plurality of first fins extending from the base plate, and
       a plurality of second fins extending from the mount plate.

15. An electronic display device of claim 14, further comprising:
    a viewing surface for displaying an image, the mount plate and base plate being spaced apart in a thickness direction that extends from the viewing surface to the rear cover.

16. The display device of claim 14, wherein the first fins include ends opposite to the base plate, and an open space is provided between the ends of the first fins and the rear cover.

17. The display device of claim 14, wherein the second fins extend from the mount plate to the rear frame, and the second fins include ends opposite to the mount plate that contact the rear frame.

18. The display device of claim 14, further comprising:
a cushion member disposed between the plurality of second fins and the rear frame, the cushion member configured to transfer heat from the rear frame to the second fins.

19. The display device of claim 14, further comprising:
a cushion member disposed between the plurality of first fins and the rear cover.

20. The display device of claim 14, further comprising:
a first screw coupling the heat sink to the rear frame, the base plate including a hole that receives the first screw; and
a second screw coupling the rear cover to the heat sink, the mount plate including a hole that receives the second screw.

* * * * *